United States Patent [19]

Bohn et al.

[11] 4,392,909
[45] Jul. 12, 1983

[54] METHOD AND DEVICE FOR PRODUCING MULTILAYER PRINTED CIRCUIT BOARDS

[75] Inventors: Hans Bohn, Schopfloch; Wolfgang Stein, Freudenstadt; Peter Bernsau, Wittlensweiler; Fred Staubitzer, Dornstetten, all of Fed. Rep. of Germany

[73] Assignee: Robert Bürkle GmbH & Co., Freudenstadt, Fed. Rep. of Germany

[21] Appl. No.: 298,722

[22] Filed: Sep. 2, 1981

[30] Foreign Application Priority Data

Sep. 2, 1980 [DE] Fed. Rep. of Germany ....... 3032931

[51] Int. Cl.³ .............................................. C09J 5/10
[52] U.S. Cl. ...................... 156/306.9; 29/830; 100/137; 100/194; 100/207; 156/311; 156/312; 156/498; 156/583.1; 174/68.5; 428/901
[58] Field of Search ............. 428/901; 156/182, 306.9, 156/288, 312, 311, 583.1, 498, 282; 100/137, 207, 194; 29/830; 174/68.5

[56] References Cited

U.S. PATENT DOCUMENTS

| | | | |
|---|---|---|---|
| 2,903,040 | 9/1959 | Schonzeit | 100/137 |
| 3,170,189 | 2/1965 | Hütter | 100/207 |
| 3,223,027 | 12/1965 | Sofa et al. | 156/498 |
| 3,374,129 | 3/1968 | Boucher | 174/68.5 |
| 3,508,330 | 4/1970 | Kubik | 174/68.5 |
| 3,654,097 | 4/1972 | Segnan | 174/68.5 |
| 3,960,635 | 6/1976 | La Roy et al. | 156/311 |

FOREIGN PATENT DOCUMENTS

| | | | |
|---|---|---|---|
| 2411650 | 1/1976 | Fed. Rep. of Germany | 100/194 |
| 509877 | 8/1971 | Switzerland | 156/498 |

Primary Examiner—John J. Gallagher
Attorney, Agent, or Firm—Joseph A. Geiger

[57] ABSTRACT

A method and device for producing multilayer printed circuit boards, under the application of heat and pressure to a stack of printed circuit boards and interposed layers of thermosetting plastic, the multilayer stack being heated in a first press to a curing temperature above the flux point of the bonding layers, then precooled under continued pressure to a transfer temperature below the flux point and transferred to a second press, where it is aftercooled under pressure to ambient temperature. The press installation of the invention includes two independently operating multi-stage presses in a common press frame. The plates of the press stages are horizontally aligned in the open position of the two presses.

6 Claims, 5 Drawing Figures

METHOD AND DEVICE FOR PRODUCING MULTILAYER PRINTED CIRCUIT BOARDS

BACKGROUND OF THE INVENTION

1. Field of the Invention

The present invention relates to the production of printed circuit boards and, more particularly, to a method and device for producing multilayer printed circuit boards, under the application of heat and pressure to a stack of circuit boards and interposed layers of thermosetting plastic.

2. Description of the Prior Art

For a variety of reasons, including the shortening of the conductor length in data processing applications, it has become advantageous and necessary in the electronics industry to utilize multilayer printed circuit boards which consist of a number of separate circuit boards arranged in a permanent stack. Each circuit board carries a pattern of conductors the manufacture of which may involve an etching process, for example. However, this manufacturing process as well as the conductor pattern on the circuit board are not relevant to the present invention.

In order to obtain a permanent bond between the superposed printed circuit boards, it is necessary to arrange between the circuit boards thin plates or sheets of thermosetting plastic material which, under the application of heat and pressure, are brought to a state of flux from which they are allowed to cure and harden to an irreversibly solid state. Once solidified, these layers of plastic material form a strong, permanent bond between the superposed printed circuit boards.

This heating and curing process necessitates the controlled introduction of heat and the coordinated application of pressure to the circuit board stack. Initially, the circuit board stack is heated, under moderate compression, to the point at which the bonding layers enter into a state of flux. After a short period of continued heat application, during which the temperature rises above the flux point, the circuit board stack is subjected to a greatly increased level of pressure. This maximum pressure is then maintained over a predetermined period of time. The simultaneous application of maximum heat and pressure is followed by a cooling cycle, under the continued application of pressure, until the bonding layers between the circuit boards are stabilized and permanently solidified.

Depending on the number of printed circuit boards which are to be assembled in a multilayer package, the prior art teaching in this field suggests the use of one or the other of two different assembly methods. Both methods have distinct advantages, but the advantages are in each case achieved at the cost of certain shortcomings.

For a circuit board stack which has up to three circuit boards and, under favorable conditions, as many as four circuit boards, it is possible to perform the heating and cooling cycles in two separate presses, the first being a heating press and the second being a cooling press. The advantages of this approach are obvious: The heating press does not require a cooling circuit and its temperature can be maintained at a high level. The use of a separate press for the cooling cycle also greatly improves the operating efficiency of the installation by allowing for the simultaneous heating of one multilayer stack and cooling of another multilayer stack.

The major shortcoming of the described method resides in the fact that the use of two separate presses requires the interruption of the compression on the multilayer stack and the transfer of the stack to the cooling press, at the maximum temperature. Following this transfer, the multilayer stack is again compressed and its temperature is lowered to the vicinity of the ambient temperature. Compression during the cooling cycle is necessary, in order to minimize displacement and/or warping of the printed circuit boards in the multilayer stack, due to the temperature gradient which is generated by the cooling process.

A major risk of this assembly method lies in the transfer of the loose and hot multilayer stack from one panel press to the other, in a state in which the bonding layers are still in a state of flux and the stack is consequently very susceptible to shifting of the printing circuit boards. It has been found that this problem is generally manageable with only three circuit board layers, but that this approach is unsuitable for stacks of more than four printed circuit boards.

For multilayer stacks of five and more circuit boards, experience has shown that it is necessary to resort to a different assembly method which involves a heating and cooling treatment of the multilayer stack in the same panel press, without pressure interruption, in order to avoid the risky stack transfer in the pressure-free state. The need for a continuous application of pressure to the multilayer stack, while assuring a distortion-free assembly, has several obvious disadvantages: Firstly, this method is very time-consuming, because the heating and cooling cycles have to be performed successively, in a single extended treatment process. This process is also very energy-intensive, making it necessary for the plates of the panel press to be heated from the ambient temperature to the maximum temperature and then to be cooled all the way down to the vicinity of the ambient temperature, before the finished multilayer stack can be removed from the panel press.

The use of separate heating and cooling presses has obvious advantages in terms of operating efficiency and related cost savings. On the other hand, the risk of producing costly rejects, due to distortions suffered in the pressure-free transfer of a multilayer stack, at or above the flux temperature of its bonding layers, has previously made it mandatory to resort to the more expensive and time-consuming second method, whenever more than four circuit boards had to be assembled into a multilayer stack.

SUMMARY OF THE INVENTION

Underlying the present invention is the primary objective of suggesting an improved method and device for producing multilayer printed circuit boards with more than four layers in a stack, in such a way that the energy consumption is minimized and the heat treatment cycle is shortened.

The present invention proposes to attain this objective with a novel method of assembling the printing circuit boards and interposed bonding layers of thermosetting plastic into a stack by heating the multilayer stack under compression in a first panel press to the curing temperature of the bonding layers, by subsequently precooling the multilayer stack under continued compression, and by then transferring the precooled multilayer stack to a second panel press, where an aftercooling treatment under compression takes place, while a new multilayer stack is heated in the first panel press.

This method makes it possible to achieve a substantial portion of the above-mentioned cost and time savings which result from the simultaneous use of two separate panel presses, while avoiding the critical shortcoming of this approach in connection with the pressure-free transfer of the multilayer stacks from one press to the other, in a highly unstable state. This favorable combination of conditions is achieved by the provision of a precooling step in the heated panel press and the transfer of the multilayer stack at a temperature at which the risk of distortion is sufficiently diminished to assure the production of multilayer circuit board stacks of predictable quality.

The invention suggests the application of a curing temperature to the multilayer stack which is above the flux temperature of the bonding layers and the simultaneous application of maximum compression, followed by a precooling treatment to a temperature below the flux temperature, prior to the transfer of the precooled multilayer stack to the aftercooling press.

In a further development of the invention, it is also possible to preheat the second panel press, prior to introduction of the precooled multilayer stack with heat which is extracted from the first panel press during its precooling cycle. Conversely, it is also possible to utilize some of the heat removed from the second press, during its aftercooling cycle, in the heating cycle of the first panel press, using a suitable heat pump as a transfer means.

BRIEF DESCRIPTION OF THE DRAWINGS

Further special features and advantages of the invention will become apparent from the description following below, when taken together with the accompanying drawings which illustrate, by way of example, an embodiment of the invention which is represented in the various figures as follows.

DESCRIPTION OF THE PREFERRED EMBODIMENT

Figure 1:
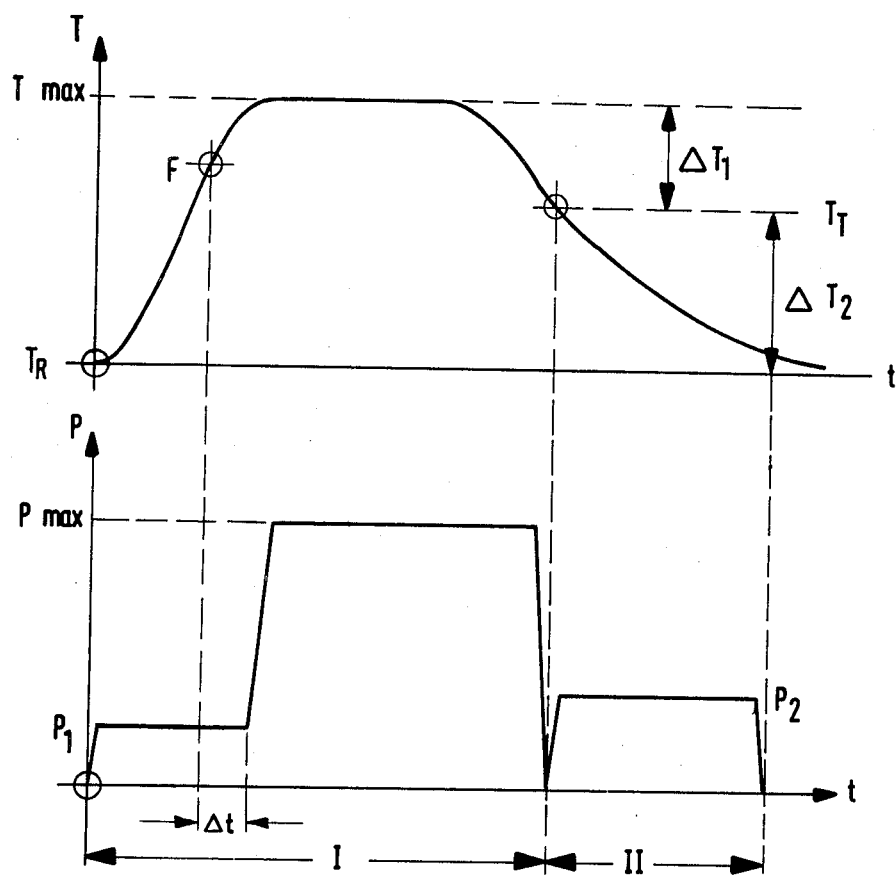
FIG. 1 shows, in a line graph, the general progression of temperature and pressure applied to a multilayer circuit board stack when assembled by the method of the present invention.

Referring to the line graph of FIG. 1, it can be seen that, in terms of temperature (T), the multilayer circuit board stack is heated from the ambient temperature $T_R$ to the maximum temperature $T_{max}$. In the course of this heating cycle, the multilayer stack reaches and exceeds the flux point F of the resin-based plastic of the bonding layers which are interposed between the printed circuit boards. As can be seen in the line graph for pressure (P), a comparatively moderate pressure $P_1$ is applied to the multilayer stack during the heating cycle. At about the time when the maximum temperature $T_{max}$ is reached, i.e. after a time delay of $\Delta t$ from the flux point F, the panel press is switched to maximum pressure $P_{max}$. Under $P_{max}$, the thermosetting resin of the bonding layers between the printed circuit boards flows into place, for an optimal bonding effect, as it is cured and transferred into a hardenable state.

The maximum temperature $T_{max}$ and the maximum pressure $P_{max}$ are maintained over a given period of time which is determined by the specific chemical and physical characteristics of the thermosetting plastic. At the end of this treatment period, the heat source of the panel press is switched off and the multilayer stack is subjected to a cooling cycle, until its temperature is at or near the ambient temperature $T_R$. At this point, the bonding layers have completely hardened, and the structure of the multilayer stack is permanently set.

The present invention now proposes to divide the cooling cycle into a precooling cycle which takes place in the first panel press, while the multilayer stack remains subjected to the maximum pressure $P_{max}$, and a subsequent aftercooling cycle which takes place in a second panel press, following the release and transfer of the multilayer stack from the first panel press. Accordingly, the temperature of the multilayer stack is lowered in the precooling cycle by a temperature reduction of $\Delta T_1$, to the transfer temperature of $T_T$, a temperature which lies below the flux temperature of the bonding layers. At this point, the multilayer stack is released from the first panel press and transferred to the second panel press, where it is aftercooled by a temperature reduction of $\Delta T_2$, to the ambient temperature $T_R$.

In FIG. 1, the total time required for the heating, curing and precooling cycles in the first panel press is indicated by the time dimension I, while the duration of the aftercooling cycle in the second panel press is indicated by the time dimension II. As can be seen in the pressure graph, the transfer takes place in a pressure-free state. However, in this state the multilayer circuit board stack has a temperature $T_T$ at which the transfer is safe, the bonding layers between the printed circuit boards having sufficiently solidified to prevent distortions of the multilayer stack in the transfer process.

In practical application, the method of the invention has been found to involve maximum temperature $T_{max}$ comprised between 150° C. and 200° C. and transfer temperatures $T_T$ comprised between approximately 80° C. and 120° C. The multilayer stack is preferably compressed during the entire heat treatment process, the partial pressures $P_1$ and $P_2$ serving to enhance the heat conduction into and out of the multilayer stack. The slightly higher partial pressure $P_2$ also serves to stabilize the cured multilayer stack during its final hardening in the aftercooling cycle. The pressure range for the partial pressures $P_1$ and $P_2$ is preferably between 2 Mp and 15 Mp, and the maximum pressure applied during the heating cycle is preferably between 10 Mp and 100 Mp.

The line graph of FIG. 1 does not take into consideration the time which is required—and any cooling that might take place—during the transfer of a multilayer stack from the first panel press to the second panel press, the actual time and temperature drop involved being negligible in comparison to the time and temperature ranges of up to one hour and approximately 100° C. which are involved in a full treatment cycle.

One of the major advantages of the present invention, viz. the shortening of the cycle time in the panel press, can be readily ascertained from FIG. 1. It can be seen that, upon reaching the transfer temperature $T_T$, the precooled multilayer stack is ready for transfer to the aftercooling press, while a new multilayer stack is introduced into the heating and curing press. Thus, while a complete treatment cycle normally requires approximately 75 minutes, i.e. the sum of the cycle times I and II, the use of two presses in accordance with the invention reduces the cycle length to the time period I of approximately 30 to 45 minutes, depending on the structure of the multilayer stack and on the specific material used for the bonding layers. It follows that the cycle time is reduced at the ratio of I:(I+II), or by as much as fifty percent.

Figure 2:
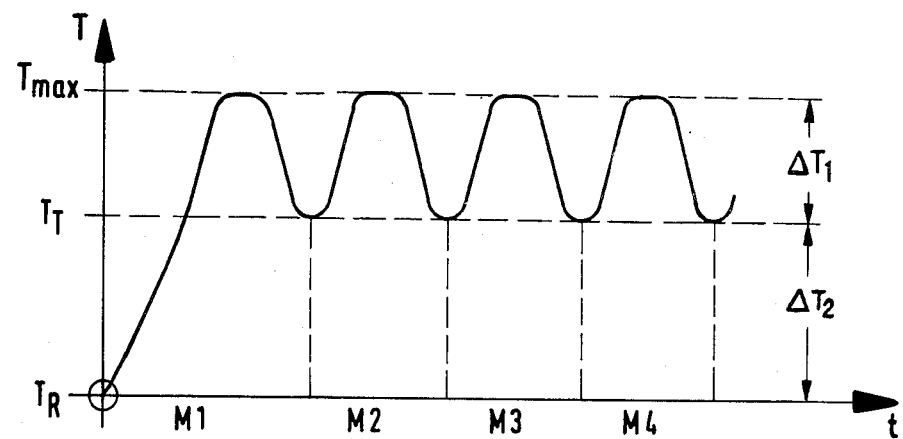
FIG. 2 shows, in a line graph, the progression of the temperature level in the heating plates of one of the two panel presses suggested by the present invention.

A second major advantage of the present invention is reflected in the line graph of FIG. 2 which shows the temperature progression in the heating plates of the first panel press. In the course of repeated assembly cycles, represented by the time periods M1 ... M4, for example, the panel press is initially heated from the ambient temperature $T_R$ to the maximum temperature $T_{max}$, to be later recooled only to the transfer temperature $T_T$, at which point the precooled multilayer stack is replaced with a new stack and the heating cycle is repeated. The temperature of the first panel press thus swings between the maximum temperature $T_{max}$ and the transfer temperature $T_T$, remaining at all times above the ambient temperature $T_R$ by the gradient of $\Delta T_2$.

Obviously, the elimination of the need for cooling the panel press to the ambient temperature $T_R$ at the end of each treatment cycle represents a great energy saving, in addition to the shortening of the treatment cycle. The result is a corresponding reduction in electricity costs, the heat source for the press plates being conventionally in the form of resistive heating rods which are embedded in the plates.

The degree to which the novel method of the invention is capable of reducing the energy consumption of the first panel press depends primarily on the level of the transfer temperature $T_T$ in relation to the maximum temperature $T_{max}$, i.e. the extent of the temperature gradient $\Delta T_1$. A higher transfer temperature $T_T$ represents a greater cost saving, but the level of this temperature is limited by the risk of irreversible distortions occuring in the precooled multilayer stack during the pressure-free transfer from the first panel press to the second panel press. It is therefore necessary to determine the highest safe transfer temperature $T_T$ from case to case, in accordance with the characteristics of the multilayer circuit board stack and the quality requirements set for the finished product.

In FIGS. 1–5 are shown structural details of an installation which is designed to perform the method of the invention, the installation consisting essentially of two panel presses in a tandem arrangement.

Figure 3:
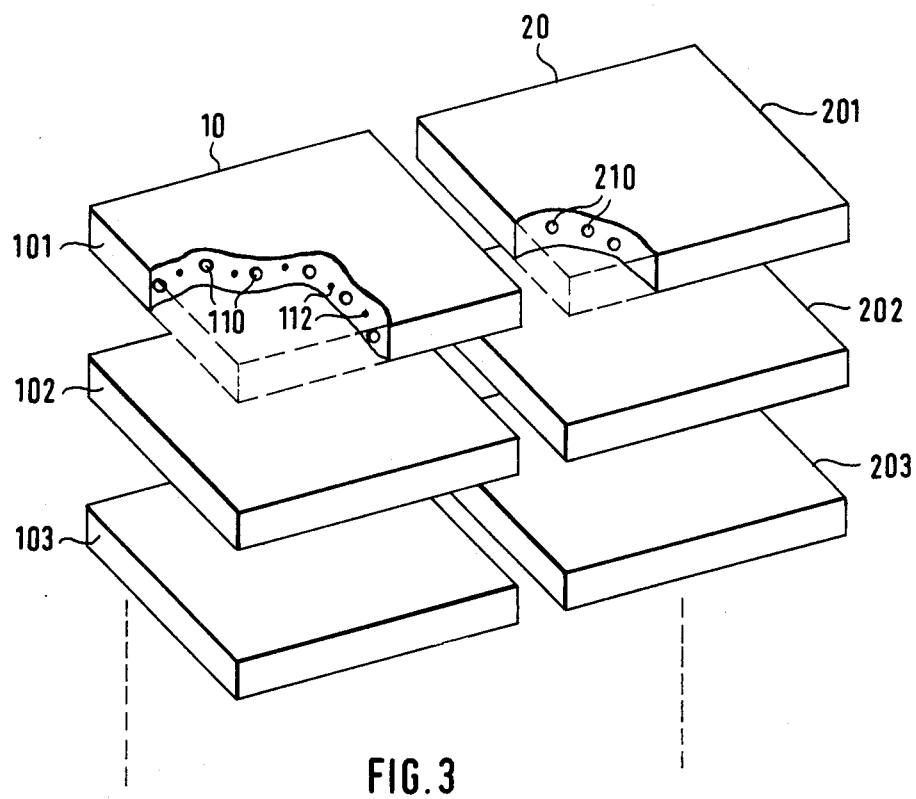
FIG. 3 shows, in a schematic outline, the arrangement of the plates of two multi-stage panel presses embodying the present invention.

FIG. 3 shows only the plates of the two panel presses in a schematic view, the heating and precooling press 10 having arranged behind it an aftercooling press 20. Both presses are in the form of multi-stage panel presses. Accordingly, the first panel press 10 consists of steel plates 101, 102, 103 etc., and the second press 20 consists of an equal number of steel plates 201, 202, 203 etc.

In a specific example, the steel plates of the first press 10 may have a thickness of 60 mm, being vertically spaced to present an opening of 100 mm, while the steel plates of the second press 20 have a thickness of 35 mm and a vertical spacing of 125 mm, in the open position of the two panel presses. In this position, the upwardly facing carrying surfaces of the several press stage of both presses are horizontally aligned, for the convenient transfer of the precooled multilayer stacks from the first panel press 10 to the second panel press 20.

A plurality of heating rods 112 in the plates 101, 102, 103 etc, of the press 10 supply the heat, and a network of cooling channels 110 in the same plates remove the heat in the precooling cycle. The second panel press 20 has in its plates a similar network of cooling channels 210 which serve for the aftercooling of the precooled multilayer stacks. A suitable cooling circuit, or circuits, using a liquid cooling medium such as water, for example, and appropriate heat transfer devices provide the cooling action in the plates of the two panel presses.

Figure 4:
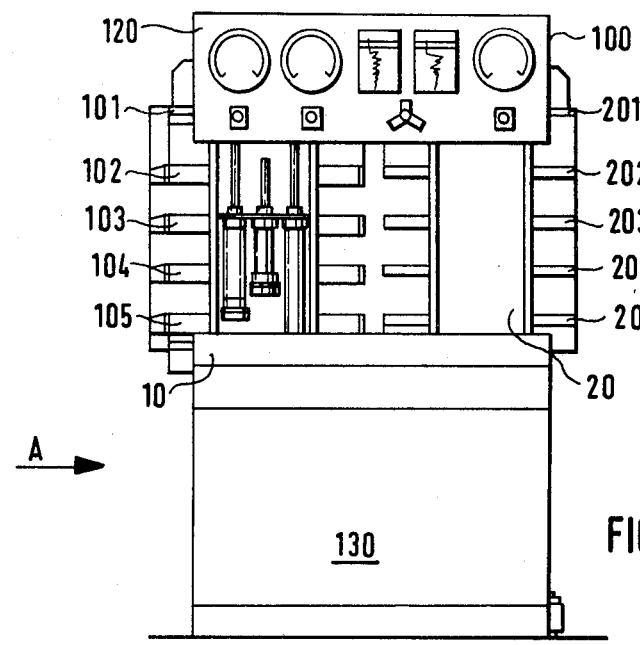
FIG. 4 is a frontal view (arrow B in FIG. 5) of a press installation featuring two panel presses, as suggested by the invention.
Figure 5:
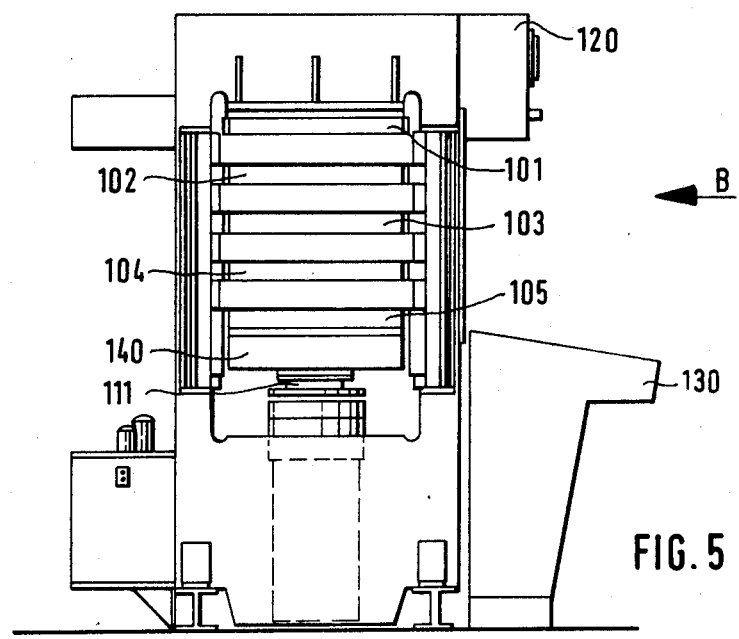
FIG. 5 is a side view (arrow A in FIG. 4) of the press installation of FIG. 4.

FIGS. 4 and 5 show such a dual-press installation in a frontal view and a side view, respectively. The two panel presses 10 and 20 form a single press installation 100, each press having four stages, for example. Accordingly, each press has five press plates 101–105 and 201–205, respectively, with horizontally aligned upper surfaces. During operation, the four stages of each panel press are closed against multilayer stacks, separate press tables 110 applying upward pressure against the lowest press plates 105 and 205. The two press tables are vertically movable by means of hydraulic cylinder units 111, their pressure being appropriately adjustable.

The proposed press installation 100 has separate instruments for the two panel presses on a common instrument board 120 and appropriate controls on a control panel 130. This makes it possible for one operator to supervise and adjust both presses simultaneously, thereby further saving production costs.

The press installation 100 further includes a set of pneumatic cylinders for the compensation of the weight of the steel plates in the several press stages, so that the same specific pressures are obtained in all stages of the panel press. The steel plates 101–105 and 201–205 of the two presses are preferably guided by lateral guide rods, and the parallel guidance of the plates is assured by means of guide prisms which are so arranged in relation to the steel plates that they automatically compensate for the expansion and contraction of the steel plates at different levels of temperature.

It should be understood, of course, that the foregoing disclosure describes only a preferred embodiment of the invention and that it is intended to cover all changes and modifications of this example of the invention which fall within the scope of the appended claims.

We claim the following:

1. A method of assembling a plurality of printed circuit boards into a permanently bonded multilayer circuit board stock, the method comprising the steps of
   stacking printed circuit boards in alternation with bonding layers of thermosetting resin-based plastic to form multilayer stacks;
   heating a first multilayer stack under compression in a first panel press to a curing temperature at which the material of the bonding layers undergoes a curing process;
   precooling the first multilayer stack under compression in the first panel press to a transfer temperature which lies between the curing temperature and the ambient temperature;
   transferring the precooled first multilayer stack from the first panel press to a second panel press;
   loading a second multilayer stack in the first panel press; and
   aftercooling the transferred multilayer stack under compression in the second panel press to a temperature in the vicinity of the ambient temperature, while heating the second multilayer stack in the first panel press as aforesaid.

2. An assembly method as defined in claim 1, wherein
the stacking step involves the use of bonding layers which assume a state of flux when heated to a flux temperature;
the heating step involves heating of the multilayer stack to a curing temperature above the flux temperature; and
the precooling step involves cooling of the multilayer stack to a transfer temperature below the flux temperature.

3. An assembly method as defined in claim 1, further comprising the steps of
holding the curing temperature in the first panel press for a period of time; and
compressing the first multilayer stack in the first panel press for at least a major portion of the holding period at a pressure which is higher than the pressure applied during the heating step and also higher than the pressure applied in the second panel press during the aftercooling step.

4. An assembly method as defined in any one of claims 1 through 3, wherein
the heating step involves heating of the multilayer stack to a curing temperature which is comprised between 150° C. and 200° C.; and
the precooling step involves cooling of the multilayer stack to a transfer temperature which is comprised between 80° C. and 120° C.

5. An assembly method as defined in any one of claims 1 through 3, further comprising the steps of
removing the aftercooled multilayer stack from the second panel press at about the start of precooling in the first panel press; and wherein
the precooling step involves the transfer of heat from the first panel press to the second panel press, in order to preheat the latter prior to the transfer step.

6. An assembly method as defined in any one of claims 1 through 3, wherein
the aftercooling step in the second panel press and the simultaneous heating step in the first panel press involve the transfer of heat from the second panel press to the first panel press with the aid of heat pumping means.

* * * * *